US008860475B1

(12) United States Patent
Yeoh et al.

(10) Patent No.: US 8,860,475 B1
(45) Date of Patent: Oct. 14, 2014

(54) TECHNIQUES FOR ADJUSTING PHASES OF CLOCK SIGNALS

(71) Applicant: Altera Corporation, San Jose, CA (US)

(72) Inventors: Tze Yi Yeoh, Gelugor (MY); Lay Hock Khoo, Georgetown (MY)

(73) Assignee: Altera Corporation, San Jose, CA (US)

( * ) Notice: Subject to any disclaimer, the term of this patent is extended or adjusted under 35 U.S.C. 154(b) by 40 days.

(21) Appl. No.: 13/853,874

(22) Filed: Mar. 29, 2013

(51) Int. Cl.
*H03L 7/06* (2006.01)
*H03L 7/199* (2006.01)

(52) U.S. Cl.
CPC ........................................ *H03L 7/199* (2013.01)
USPC ............ 327/150; 327/231; 327/163; 327/160

(58) Field of Classification Search
None
See application file for complete search history.

(56) References Cited

U.S. PATENT DOCUMENTS

| 6,687,321 | B1 | 2/2004 | Kada et al. | |
| 7,453,968 | B2 * | 11/2008 | Chang et al. | 375/355 |
| 7,555,667 | B1 * | 6/2009 | Burney et al. | 713/401 |
| 7,644,296 | B1 | 1/2010 | Burney | |
| 8,120,407 | B1 * | 2/2012 | Ooi et al. | 327/241 |
| 8,149,038 | B1 * | 4/2012 | Sung et al. | 327/231 |
| 8,222,920 | B2 * | 7/2012 | Barbier | 326/38 |
| 8,291,255 | B1 | 10/2012 | Vijayaraghavan et al. | |
| 8,368,449 | B1 * | 2/2013 | Bui et al. | 327/231 |
| 2005/0259775 | A1 | 11/2005 | Chang et al. | |
| 2012/0063556 | A1 | 3/2012 | Hoang | |

OTHER PUBLICATIONS

Altera Corporation, "9. High-Speed Differential I/O Interfaces and DPA in Stratix III Devices," Stratix III Device Handbook, vol. 1, Jul. 2010, pp. 1-28.
Altera Corporation, "High-Speed Differential I/O Interfaces and DPA in Arria V Devices," Nov. 19, 2012, pp. 1-31.
Altera Corporation, "High-Speed Differential I/O Interfaces and DPA in Stratix V Devices," Dec. 28, 2012, pp. 1-26.

* cited by examiner

*Primary Examiner* — Cassandra Cox
(74) *Attorney, Agent, or Firm* — Steven J. Cahill

(57) ABSTRACT

A first phase alignment circuit generates an indication of a phase of a first clock signal. A second phase alignment circuit adjusts a phase of a second clock signal based on a data signal. The second phase alignment circuit adjusts the phase of the second clock signal based on the indication of the phase of the first clock signal. The second phase alignment circuit resets an indication of the phase of the second clock signal generated based on the data signal in response to the indication of the phase of the first clock signal. The second phase alignment circuit captures a value of the data signal in response to the second clock signal.

20 Claims, 11 Drawing Sheets

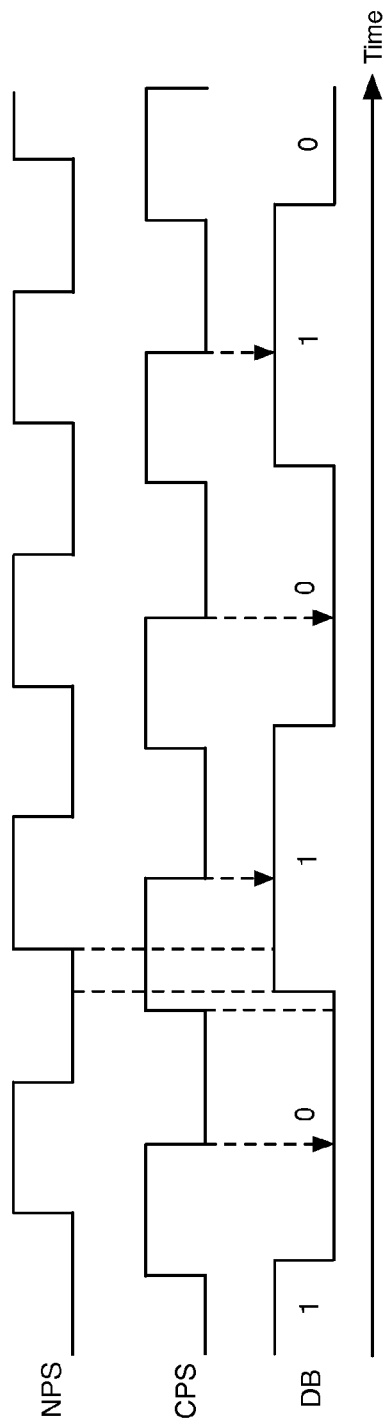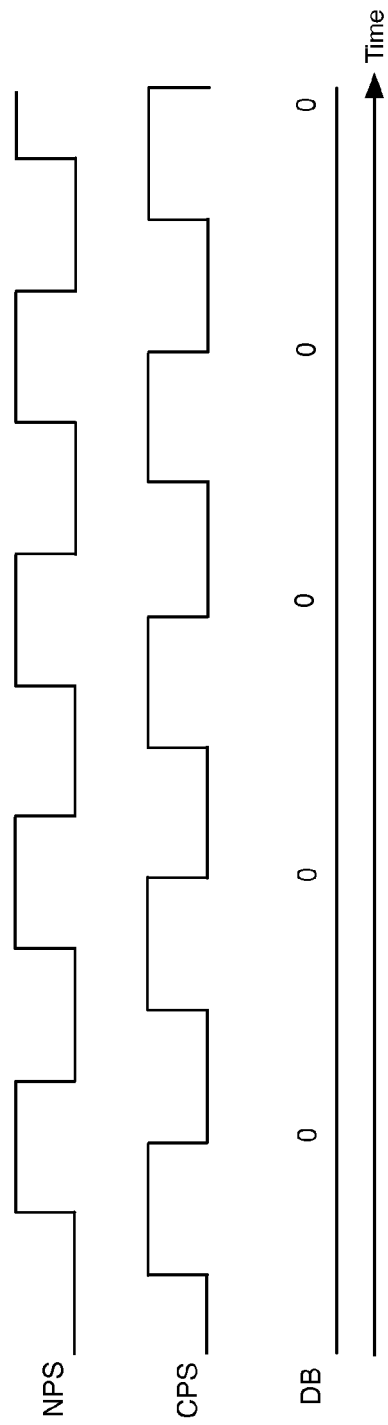

US 8,860,475 B1

TECHNIQUES FOR ADJUSTING PHASES OF CLOCK SIGNALS

FIELD OF THE DISCLOSURE

The present disclosure relates to electronic circuits, and more particularly to techniques for adjusting phases of clock signals using electronic circuits.

BACKGROUND

Programmable logic integrated circuits are used in a wide variety of applications, such as consumer display devices. A programmable logic integrated circuit in a consumer display device may perform image processing functions on video data to generate processed video data. The processed video data is then provided for display on the consumer display device.

BRIEF SUMMARY

According to some embodiments, a first phase alignment circuit generates an indication of a phase of a first clock signal. A second phase alignment circuit adjusts a phase of a second clock signal based on a data signal. The second phase alignment circuit adjusts the phase of the second clock signal based on the indication of the phase of the first clock signal. The second phase alignment circuit resets an indication of the phase of the second clock signal generated based on the data signal in response to the indication of the phase of the first clock signal. The second phase alignment circuit captures a value of the data signal in response to the second clock signal.

According to other embodiments, a first phase detector circuit compares a phase of a first clock signal to a phase of a second clock signal to generate a first phase detection signal. A first control circuit generates an indication to adjust the phase of the second clock signal based on the first phase detection signal. A first multiplexer circuit adjusts the phase of the second clock signal based on the indication to adjust the phase of the second clock signal. A second phase detector circuit compares a phase of a third clock signal to a data signal to generate a second phase detection signal. A second control circuit generates an indication to adjust the phase of the third clock signal based on the second phase detection signal. A second multiplexer circuit adjusts the phase of the third clock signal based on the indication to adjust the phase of the third clock signal and based on the indication to adjust the phase of the second clock signal.

Various objects, features, and advantages of the present invention will become apparent upon consideration of the following detailed description and the accompanying drawings.

BRIEF DESCRIPTION OF THE DRAWINGS

FIG. 8A is a timing diagram that illustrates examples of waveforms of three of the signals shown in FIG. 6 including a buffered data signal that contains a repeating pattern of logic high and low bits, according to an embodiment of the present invention.

FIG. 8B is a timing diagram that illustrates examples of waveforms of three of the signals shown in FIG. 6 including a buffered data signal that contains a series of logic low bits, according to another embodiment of the present invention.

DETAILED DESCRIPTION

Figure 1:
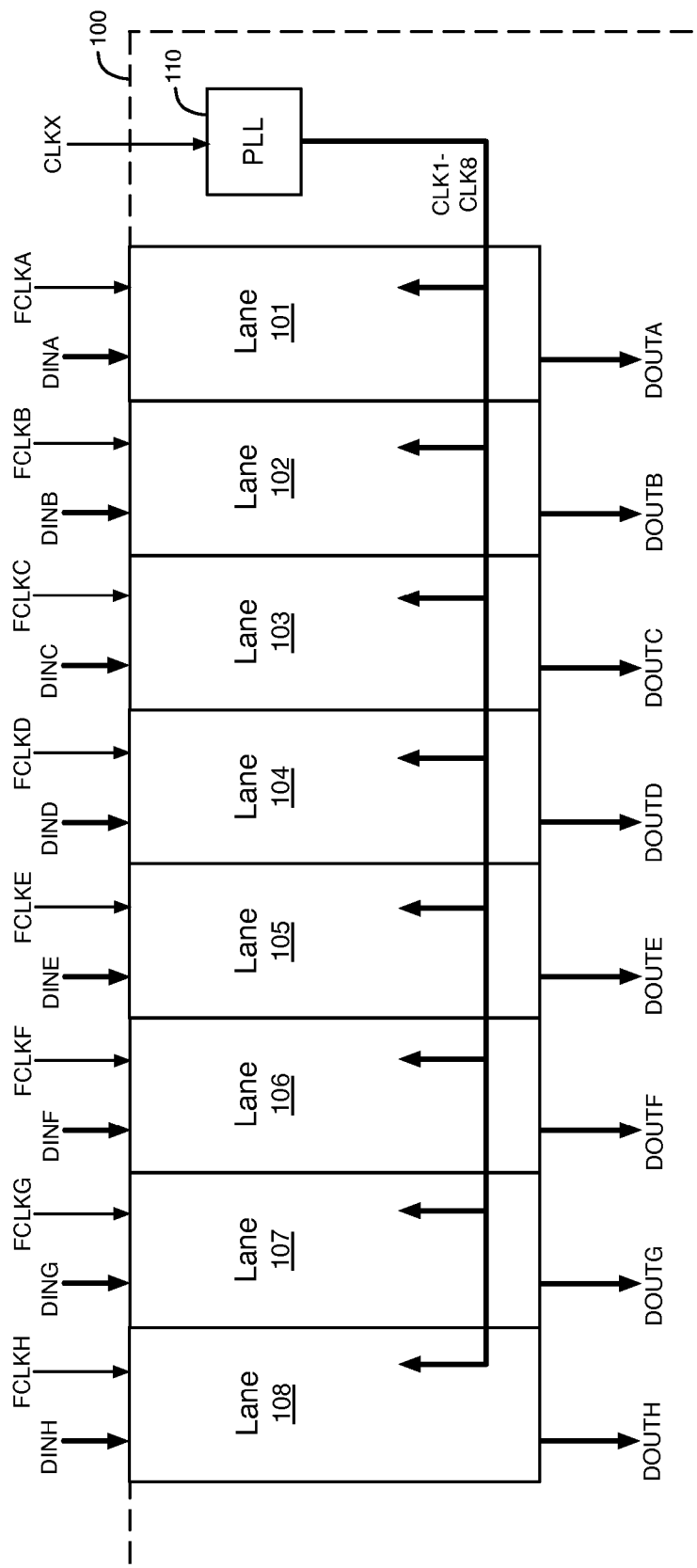
FIG. 1 illustrates an example of an interface circuit in an integrated circuit, according to an embodiment of the present invention.

Integrated circuits can process a variety of data types. For example, a programmable logic integrated circuit can perform image processing functions on video data to generate processed video data for display on a consumer display device, as mentioned above. In many applications, video data, or other types of data, are transmitted to an integrated circuit at a high data rate. Data may be transmitted in multiple sets of data signals through a circuit board to the integrated circuit to reduce the data rate of each individual data signal.

In some applications, each set of data signals is provided to a different lane within an interface circuit in the integrated circuit. Each of the lanes in the interface circuit includes dynamic phase alignment (DPA) circuits. DPA circuits are also referred to herein as phase alignment circuits. Each of the data signals is buffered and then provided to a different DPA circuit as a buffered data signal. Each DPA circuit receives a set of multi-phase clock signals from a phase-locked loop (PLL) circuit and selects the clock signal phase that is closest to the phase of its respective buffered data signal. Each of the DPA circuits samples its respective buffered data signal in response to the selected clock signal phase to generate a sampled data signal. Clocks signals as described herein are periodic signals.

Variations in the temperature or voltage on the circuit board may cause the data in one or more sets of the data signals to shift in time with respect to one or more of the other sets of the data signals. Forwarded clock signals are provided to the integrated circuit with the data signals. A different forwarded clock signal is provided to each lane of the interface circuit with each set of the data signals. The forwarded clock signal provided with each set of the data signals presents a consistent and accurate proxy of edge information of the data signals that accounts for timing and phase shifts of the data signals.

A phase-locked loop (PLL) circuit may be included in each of the lanes in the interface circuit to generate clock signals that are used to sample each respective set of the data signals. Each PLL generates its clock signals based on the forwarded clock signal provided with the respective set of data signals to a lane. However, if the interface circuit has a large number of lanes (e.g., 8), then the interface circuit has a large number of PLLs. A large number of PLLs consumes a significant amount of die area on the integrated circuit. Also, it may be difficult to provide noise isolation between the input/output buffers and many PLLs in the integrated circuit.

Alternatively, the DPA circuits in all of the lanes of the interface circuit may sample the data signals using the same set of clock signals generated by the same PLL circuit. The PLL circuit generates the clock signals using the forwarded clock signal that is transmitted with one of the sets of data signals to one of the lanes in the interface circuit.

All of the DPA circuits in the interface circuit need to track edge transitions in their respective data signals in order to maintain sufficient bit margin. However, the low voltage differential signaling (LVDS) specification for video data signals in consumer display devices does not guarantee edge transitions in the data signals. For example, video data signals representing blank screens may have long runs of one bits or zero bits.

The DPA circuits may generate bit errors in the sampled data signals if the DPA circuits do not receive enough edge transitions in their respective data signals to select the correct clock signal phase. If the DPA circuits in all of the lanes sample the data signals received at their respective lanes using clock signals generated by the same PLL, the DPA circuits may generate a large number of bit errors in the sampled data signals if the data signals received at one or more lanes have shifted in time by more than a bit margin with respect to the data signals received at the other lanes.

According to some embodiments described herein, a master DPA circuit in each of the lanes in an interface circuit generates control signals using the forwarded clock signal that is transmitted with the data signals to the respective lane. The control signals are provided to one or more slave DPA circuits in the same lane. Each of the slave DPA circuits in the lane selects a clock signal phase based on the control signals generated by the master DPA circuit in the same lane. Each of the slave DPA circuits in the lane samples a respective data signal in response to the clock signal phase selected based on the control signals to generate a sampled data signal.

FIG. 1 illustrates an example of an interface circuit in an integrated circuit, according to an embodiment of the present invention. FIG. 1 illustrates a portion of an integrated circuit 100. Integrated circuit 100 includes a phase-locked loop (PLL) circuit 110 and the interface circuit. The interface circuit includes eight lanes 101-108. In an embodiment, each of the lanes 101-108 includes identical circuitry.

A reference clock signal CLKX is generated by a device external to integrated circuit 100. Reference clock signal CLKX is transmitted to an input of PLL circuit 110. PLL circuit 110 generates 8 clock signals CLK1, CLK2, CLK3, CLK4, CLK5, CLK6, CLK7, and CLK8 (i.e., CLK1-CLK8) in response to reference clock signal CLKX. In an embodiment, PLL circuit 110 multiples the frequency of reference clock signal CLKX by a frequency multiplication factor to generate the frequencies of clock signals CLK1-CLK8. In an embodiment, the frequency multiplication factor of PLL circuit 110 is a positive integer number greater than 1 (e.g., 7).

Clock signals CLK1-CLK8 are offset in phase from each other by 45° intervals. Clock signals CLK1-CLK8 have relative phases of 0°, 45°, 90°, 135°, 180°, 225°, 270°, and 315°, respectively. Clock signals CLK1-CLK8 are provided from PLL 110 to inputs of each of the eight lanes 101-108 through a bus, as shown in FIG. 1.

One or more transmitting devices transmit a set of data signals and a forwarded clock signal to each of the 8 lanes shown in FIG. 1 through external conductive links. The transmitting devices are external to integrated circuit 100. Data signals DINA, DINB, DINC, DIND, DINE, DINF, DING, and DINH are transmitted to lanes 101-108, respectively. Data signals DINA, DINB, DINC, DIND, DINE, DINF, DING, and DINH (i.e., DINA-DINH) are eight sets of data signals. Each of the eight sets of data signals DINA-DINH may have one, two, three, four, five, or more data signals. The data signals may be serial or parallel data signals. Eight different forwarded clock signals FCLKA, FCLKB, FCLKC, FCLKD, FCLKE, FCLKF, FCLKG, and FCLKH (i.e., FCLKA-FCLKH) are transmitted to lanes 101-108, respectively.

Lanes 101-108 sample and deserialize the data in data signals DINA, DINB, DINC, DIND, DINE, DINF, DING, and DINH to generate data in output data signals DOUTA, DOUTB, DOUTC, DOUTD, DOUTE, DOUTF, DOUTG, and DOUTH based on clock signals FCLKA, FCLKB, FCLKC, FCLKD, FCLKE, FCLKF, FCLKG, and FCLKH, respectively, using clock signals CLK1-CLK8. Reference clock signal CLKX is also transmitted to the transmitting devices that generate data signals DINA-DINH and forwarded clock signals FCLKA-FCLKH. The transmitting devices generate data signals DINA-DINH and forwarded clock signals FCLKA-FCLKH in response to the reference clock signal CLKX. The transmitting devices and integrated circuit 100 are synchronous, because the data is transmitted and received in response to the same clock signal CLKX.

Figure 2:
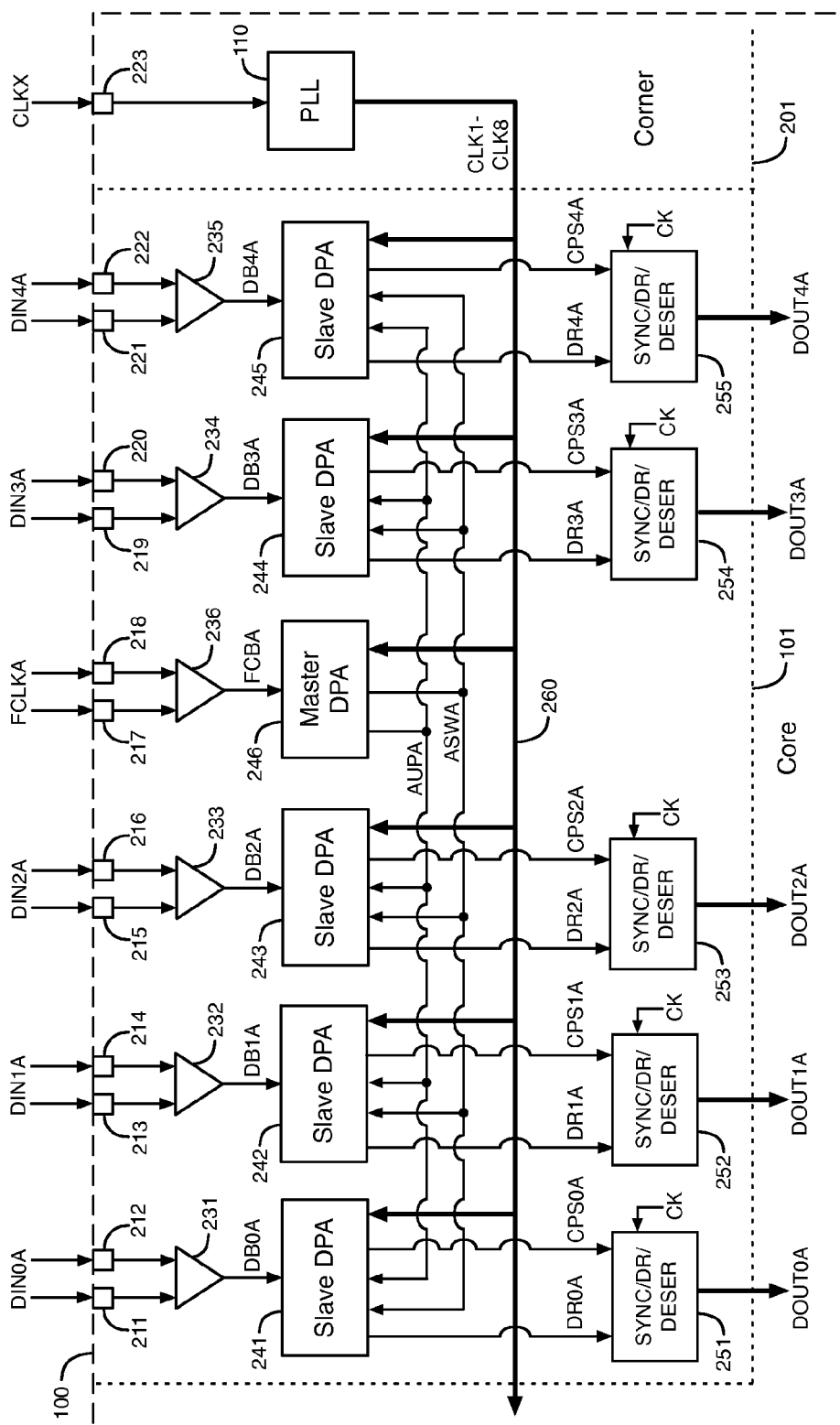
FIG. 2 illustrates further details of one of the lanes in the interface circuit shown in FIG. 1, according to an embodiment of the present invention.

FIG. 2 illustrates further details of lane 101 in the interface circuit shown in FIG. 1 in integrated circuit 100, according to an embodiment of the present invention. In an embodiment, each of the other 7 lanes 102-108 in the interface circuit shown in FIG. 1 has the same circuit structure as lane 101 shown in FIG. 2. Thus, in this embodiment, the circuitry shown in lane 101 in FIG. 2 is replicated within each of the 8 lanes 101-108 in the interface circuit. In this embodiment, each of lanes 102-108 has the same functionality as described below with respect to lane 101.

As shown in FIG. 2, lane 101 includes 12 input pins 211-222, 6 input buffer circuits 231-236, 5 slave dynamic phase alignment (DPA) circuits 241-245, a master DPA circuit 246, and 5 circuits 251-255. Each of the 5 circuits 251-255 includes a synchronizer circuit (SYNC), a data realignment (DR) circuit, and a deserializer (DESER) circuit. A corner region 201 of integrated circuit 100 includes phase-locked loop (PLL) circuit 110 and pin 223.

Reference clock signal CLKX is provided to PLL circuit 110 through pin 223. The 8 clock signals CLK1-CLK8 generated by PLL 110 are provided to inputs of each of the slave DPA circuits 241-245 and to inputs of master DPA circuit 246 through bus 260. In the embodiment of FIG. 2, input data signals DINA shown in FIG. 1 include 5 differential data signals DIN0A, DIN1A, DIN2A, DIN3A, and DIN4A (i.e., DIN0A-DIN4A). Each of data signals DIN0A, DIN1A, DIN2A, DIN3A, and DIN4A indicates a stream of digital data bits. In an embodiment, data signals DIN0A, DIN1A, DIN2A, DIN3A, and DIN4A are a set of 5 parallel data signals. In an alternative embodiment, data signals DIN0A, DIN1A, DIN2A, DIN3A, and DIN4A are 5 serial data signals.

Differential data signals DIN0A, DIN1A, DIN2A, DIN3A, and DIN4A are transmitted from a single external transmitting device to pins 211-212, 213-214, 215-216, 219-220, and 221-222, respectively, as shown in FIG. 2. Forwarded clock signal FCLKA is a differential clock signal in FIG. 2. Forwarded clock signal FCLKA is transmitted to pins 217-218 from the same external transmitting device that generates data signals DIN0A-DIN4A. Pins 211-223 are conductive areas on the surface of integrated circuit 100 that are used as external terminals of integrated circuit 100.

Data signals DIN0A, DIN1A, DIN2A, DIN3A, and DIN4A are provided from pins 211-212, 213-214, 215-216, 219-220, and 221-222 to inputs of input buffer circuits 231, 232, 233, 234, and 235, respectively. Input buffer circuits 231-235 buffer data signals DIN0A, DIN1A, DIN2A, DIN3A, and DIN4A to generate buffered data signals DB0A, DB1A, DB2A, DB3A, and DB4A, respectively, at their outputs. Buffered data signals DB0A, DB1A, DB2A, DB3A, and DB4A are provided to inputs of slave DPA circuits 241, 242, 243, 244, and 245, respectively.

Forwarded clock signal FCLKA is provided from pins 217-218 to inputs of buffer circuit 236. Buffer circuit 236 buffers clock signal FCLKA to generate a buffered forwarded clock signal FCBA. The buffered forwarded clock signal FCBA is provided to an input of master DPA circuit 246.

Data signals DINA-DINH may be transmitted to the integrated circuit 100 from two, three, four, or more external transmitting devices. Process or temperature variations between the transmitting devices may cause one or more of data signals DINA-DINH to arrive earlier or later in time than the other data signals DINA-DINH. Also, voltage or temperature changes in the external conductive links that the data signals DINA-DINH are transmitted through from the external transmitting devices to integrated circuit 100 may cause variations in the relative timing of two or more of data signals DINA-DINH.

Each of the 8 forwarded clock signals FCLKA-FCLKH is transmitted to integrated circuit 100 from the same external transmitting device through the same set of external links to the same lane as a respective set of the data signals DINA-DINH. Each of the forwarded clock signals embodies a consistent and accurate proxy of the edge transitions in every data signal within its respective lane. Thus, forwarded clock signals FCLKA-FCLKH embody consistent and accurate proxies of the edge transitions in data signals DINA-DINH within lanes 101-108, respectively. For example, clock signal FCLKA provides consistent and accurate information for the edge transitions in data signals DINA (i.e., data signals DIN0A-DIN4A). As another example, clock signal FCLKD provides consistent and accurate information for the edge transitions in data signals DIND. The forwarded clock signals FCLKA-FCLKH provided to lanes 101-108 track timing variations in data signals DINA-DINH, respectively.

Master DPA circuit 246 tracks changes in the phase of the buffered forwarded clock signal FCBA. Master DPA circuit 246 generates control signals AUPA and ASWA based on the buffered forwarded clock signal FCBA and clock signals CLK1-CLK8. Master DPA circuit 246 causes control signals AUPA and ASWA to indicate changes in the phase of forwarded clock signal FCBA. Both of the control signals AUPA and ASWA are provided to inputs of each of the slave DPA circuits 241-245, as shown in FIG. 2. Further details of a master DPA circuit are shown in and described below with respect to FIG. 3.

Each of the slave DPA circuits 241-245 selects one of the clock signals CLK1-CLK8 as a current phase clock signal. Slave DPA circuits 241-245 select from clock signals CLK1-CLK8 to generate current phase clock signals CPS0A, CPS1A, CPS2A, CPS3A, and CPS4A based on buffered data signals DB0A, DB1A, DB2A, DB3A, and DB4A, respectively, and based on control signals AUPA and ASWA. Slave DPA circuits 241-245 output the current phase clock signals CPS0A, CPS1A, CPS2A, CPS3A, and CPS4A, respectively.

Each of the slave DPA circuits 241-245 uses its current phase clock signal to sample the respective buffered data signal to generate a retimed data signal. Slave DPA circuits 241-245 sample buffered data signals DB0A, DB1A, DB2A, DB3A, and DB4A in response to current phase clock signals CPS0A, CPS1A, CPS2A, CPS3A, and CPS4A to generate retimed data signals DR0A, DR1A, DR2A, DR3A, and DR4A, respectively. Each of the slave DPA circuits 241-245 selects its current phase clock signal based on changes in the phase of the forwarded clock signal FCBA/FCLKA as indicated by control signals AUPA and ASWA.

Slave DPA circuits 241-245 use control signals AUPA and ASWA to cause the current phase clock signals CPS0A, CPS1A, CPS2A, CPS3A, and CPS4A (i.e., CPS0A-CPS4A), respectively, to track changes in the phase of the forwarded clock signal FCLKA provided to lane 101. Because phase changes in clock signal FCLKA are a proxy for variations in the timing of data signals DIN0A-DIN4A, slave DPA circuits 241-245 cause clock signals CPS0A-CPS4A to track changes in the timing of data signals DIN0A-DIN4A. As a result, slave DPA circuits 241-245 are able to sample accurate values of the bits indicated by data signals DB0A-DB4A, respectively, despite timing variations in data signals DIN0A-DIN4A. Further details of a slave DPA circuit are shown in and described below with respect to FIG. 4.

Current phase clock signals CPS0A-CPS4A are provided to inputs of circuits 251-255, respectively. Retimed data signals DR0A, DR1A, DR2A, DR3A, and DR4A are provided to inputs of circuits 251-255, respectively.

Each of circuits 251-255 deserializes the data bits in the respective retimed data signal to generate a set of parallel output data signals. Circuits 251-255 deserialize the data bits in retimed data signals DR0A, DR1A, DR2A, DR3A, and DR4A to generate output data signals DOUT0A, DOUT1A, DOUT2A, DOUT3A, and DOUT4A, respectively. Circuits 251-255 generate a multiple of 5 data signals DOUT0A, DOUT1A, DOUT2A, DOUT3A, and DOUT4A (i.e., DOUT0A-DOUT4A). If data signals DIN0A-DIN4A are 5 parallel data signals, the deserializer circuits in circuits 251-255 deserialize each parallel data signal to generate two or more parallel data signals.

In some embodiments, each of circuits 251-255 includes a synchronizer circuit. If the synchronizer circuits are enabled, the data bits indicated by the retimed data signals DR0A, DR1A, DR2A, DR3A, and DR4A are stored in storage circuits in the synchronizer circuits in response to current phase clock signals CPS0A, CPS1A, CPS2A, CPS3A, and CPS4A, respectively. The data bits indicated by the retimed data signals DR0A, DR1A, DR2A, DR3A, and DR4A are read from the synchronizer circuits in response to a clock signal CK generated by PLL circuit 110.

One or more sets of the 8 sets of data signals DINA-DINH may be skewed with respect to the other sets of data signals DINA-DINH. The skew may be caused by the external transmitting devices that transmit the data signals or the links that the data signals are transmitted through. If data signals DINA-DINH are skewed, the data bits in data signals DINA-DINH may be captured with different clock phases at the slave DPA circuits in lanes 101-108. The different clock phases may cause misalignment of the data bits in the output data signals DOUTA-DOUTH. To establish the correct word boundaries in each set of data signals DOUTA-DOUTH, each of circuits 251-255 in each of lanes 101-108 has a data realignment circuit that removes any skew in the data bits indicated by the respective data signals. As a result, each set of data bits in data signals DOUTA-DOUTH is an accurate representation of a portion of the data.

The data bits read from the synchronizer circuit in each of circuits 251-255 are provided to the respective data realignment circuit. The data realignment circuits in circuits 251-255 align the data bits in response to clock signal CK to generate realigned data bits having the correct word boundaries. Each of circuits 251-255 has a deserializer circuit. The deserializer circuits in circuits 251-255 deserialize the respective realigned data bits in response to clock signal CK to generate deserialized output data signals DOUT0A, DOUT1A, DOUT2A, DOUT3A, and DOUT4A, respectively.

In other embodiments, circuits 251-255 do not have synchronizer circuits, or the synchronizer circuits in circuits 251-255 are disabled or not used in a particular mode. In these embodiments, the data realignment circuits in circuits 251-255 align the data bits in data signals DR0A-DR4A in response to the current phase clock signals CPS0A, CPS1A, CPS2A, CPS3A, and CPS0A, respectively, to generate realigned data bits having the correct word boundaries. The deserializer circuits in circuits 251-255 deserialize the respective realigned data bits in response to clock signals CPS0A, CPS1A, CPS2A, CPS3A, and CPS4A to generate deserialized output data signals DOUT0A, DOUT1A, DOUT2A, DOUT3A, and DOUT4A, respectively.

Figure 3:
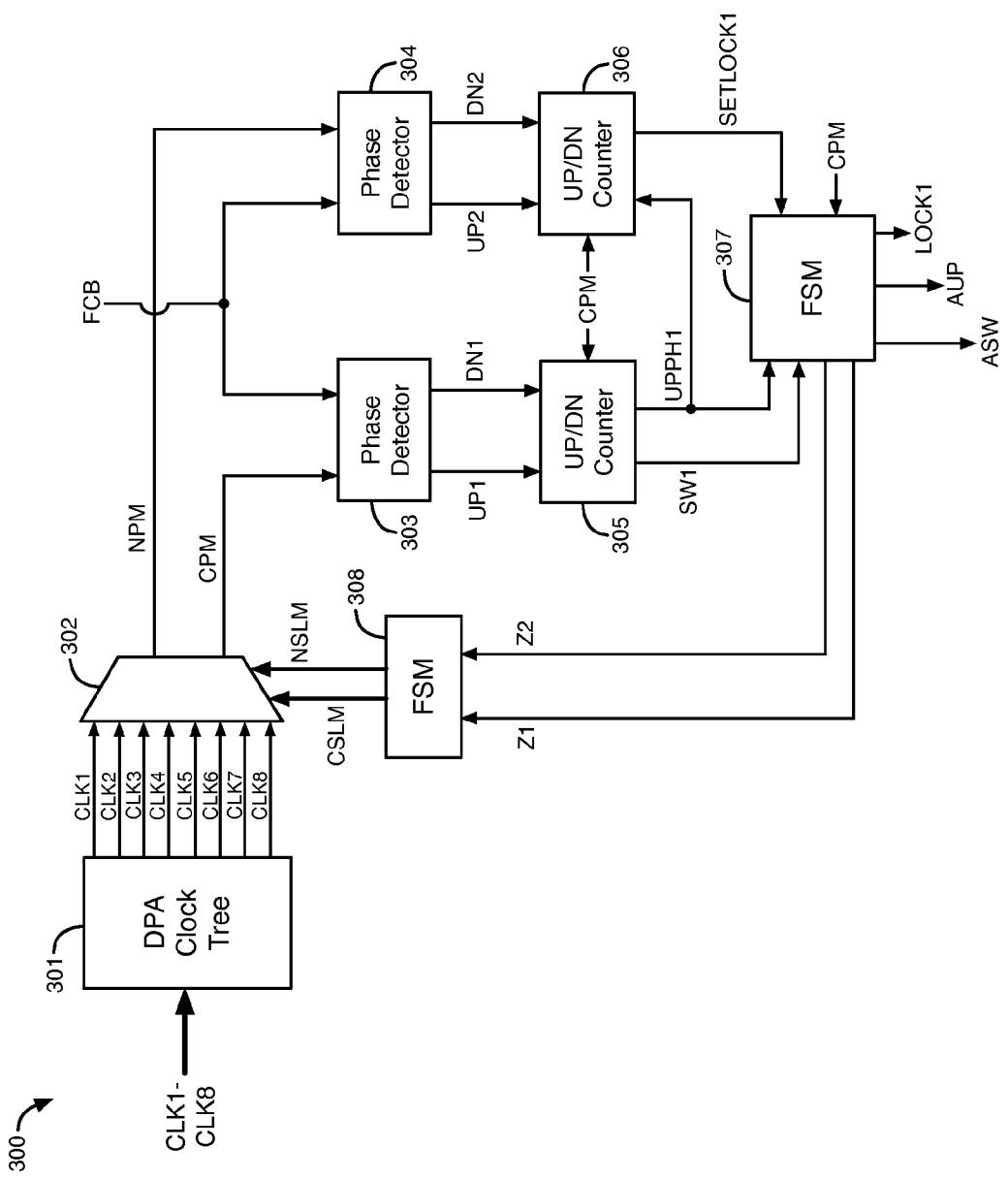
FIG. 3 illustrates an example of a master dynamic phase alignment (DPA) circuit, according to an embodiment of the present invention.

FIG. 3 illustrates an example of a master dynamic phase alignment (DPA) circuit 300, according to an embodiment of the present invention. Master DPA circuit 300 is an example of master DPA circuit 246 shown in FIG. 2. Master DPA circuit 300 is also an example of the master DPA circuit in each of the other 7 lanes 102-108 in the interface circuit. In an embodiment, the master DPA circuit in each of the 8 lanes 101-108 has the circuit structure and functionality of master DPA circuit 300.

Master DPA circuit 300 includes DPA clock tree 301, multiplexer circuit 302, phase detector circuits 303-304, up/down (UP/DN) counter circuits 305-306, finite state machine (FSM) circuit 307, and FSM circuit 308. The clock signals CLK1-CLK8 generated by PLL circuit 110 are provided to 8 multiplexing inputs of multiplexer circuit 302 through DPA clock tree 301. DPA clock tree 301 includes conductors that provide clock signals CLK1-CLK8 to multiplexer circuit 302. DPA clock tree 301 provides the same delay to each of clock signals CLK1-CLK8. FSM circuits 307-308 and counter circuits 305-306 function as control circuits. FSM circuits 307-308 may, for example, be implemented by logic circuits.

Multiplexer circuit 302 has two multiplexing outputs. Multiplexer circuit 302 outputs a next phase clock signal NPM at its first multiplexing output. Multiplexer circuit 302 outputs a current phase clock signal CPM at its second multiplexing output.

Two digital select signals NSLM are provided to a first set of two select inputs of multiplexer circuit 302. Multiplexer circuit 302 selects one of the 8 clock signals CLK1-CLK8 at its multiplexing inputs as a first selected clock signal based on the digital values of select signals NSLM. Multiplexer circuit 302 provides the first selected clock signal to its first multiplexing output as the next phase clock signal NPM.

Two digital select signals CSLM are provided to a second set of two select inputs of multiplexer circuit 302. Multiplexer circuit 302 selects one of the 8 clock signals CLK1-CLK8 at its multiplexing inputs as a second selected clock signal based on the digital values of select signals CSLM. Multiplexer circuit 302 provides the second selected clock signal to its second multiplexing output as the current phase clock signal CPM.

Finite state machine (FSM) 308 generates select signals NSLM and CSLM. FSM 308 and multiplexer circuit 302 cause the phase of the next phase clock signal NPM to be 45° after the phase of the current phase clock signal CPM. For example, if the current phase clock signal CPM has a phase of 0°, then the next phase clock signal NPM has a phase of 45°.

Master DPA circuit 300 receives a buffered forwarded clock signal FCB from an input buffer circuit. In master DPA circuit 246, the buffered forwarded clock signal FCB shown in FIG. 3 is the buffered forwarded clock signal FCBA shown in FIG. 2. For the master DPA circuits in lanes 102-108, the buffered forwarded clock signal FCB shown in FIG. 3 is a buffered forwarded clock signal generated from a respective one of the forwarded clock signals FCLKB-FCLKH.

Phase detector circuit 303 compares the phase of the current phase clock signal CPM to the phase of the buffered forwarded clock signal FCB to generate two phase detection signals UP1 and DN1. Phase detector circuit 303 causes the UP1 signal to be in a logic high state and the DN1 signal to be in a logic low state each time that a rising edge in the current phase clock signal CPM occurs before a rising edge in the buffered forwarded clock signal FCB. Phase detector circuit 303 causes the DN1 signal to be in a logic high state and the UP1 signal to be in a logic low state each time that a rising edge in the current phase clock signal CPM occurs after a rising edge in the buffered forwarded clock signal FCB.

Phase detection signals UP1 and DN1 are provided to up and down inputs, respectively, of UP/DN counter circuit 305. The current phase clock signal CPM is provided to a clock input of UP/DN counter circuit 305. UP/DN counter circuit 305 generates a digital count value. The digital count value of counter circuit 305 has an initial default value of zero after integrated circuit 100 powers up. UP/DN counter circuit 305 increments its digital count value by one in response to each rising edge of clock signal CPM that occurs when the UP1 signal is in a logic high state. UP/DN counter circuit 305 decrements its digital count value by one in response to each rising edge of clock signal CPM that occurs when the DN1 signal is in a logic high state. Alternatively, the digital count value may be incremented or decremented in response to each falling edge of clock signal CPM.

UP/DN counter circuit 305 generates two digital output signals UPPH1 and SW1 based on its digital count value. UP/DN counter circuit 305 includes logic circuitry that causes the UPPH1 signal to be in a logic high state when the digital count value of UP/DN counter circuit 305 is greater than 0. The logic circuitry in UP/DN counter circuit 305 causes the UPPH1 signal to be in a logic low state when the digital count value of UP/DN counter circuit 305 is 0 or less than 0.

UP/DN counter circuit 305 generates a logic high pulse in signal SW1 each time that the phase of the current phase clock signal CPM is leading (i.e., occurring earlier in time than) the phase of forwarded clock signal FCB during a predefined number M of clock cycles more than the number of clock cycles during which CPM is lagging behind (i.e., occurring later in time than) FCB. UP/DN counter circuit 305 generates a logic high pulse in signal SW1 each time that the phase of the current phase clock signal CPM is lagging behind (i.e., occurring later in time than) the phase of forwarded clock signal FCB during an M number of clock cycles more than the number of clock cycles during which CPM is leading (i.e., occurring earlier in time than) FCB.

A logic high pulse in a digital signal includes a logic low-to-high transition followed by a logic high-to-low transition. A logic low pulse in a digital signal includes a logic high-to-low transition followed by a logic low-to-high transition. In alternative embodiments, any one or more of the circuits described herein as generating a logic high pulse in a digital signal to indicate a particular condition may instead generate a logic low pulse or simply a logic transition in that digital signal to indicate the same condition.

The logic circuitry in UP/DN counter circuit 305 generates a logic high pulse in signal SW1 each time that its digital count value reaches M or −M, where M is a predefined non-zero integer. According to an exemplary embodiment, the logic circuitry in UP/DN counter circuit 305 generates a logic high pulse in signal SW1 each time that its digital count value reaches +32 or −32 (i.e., M=32). After the digital count value of counter circuit 305 reaches M (e.g., +32), counter circuit 305 resets its digital count value to zero. Also, after the digital count value of counter circuit 305 reaches −M (e.g., −32), counter circuit 305 resets its digital count value to zero. Control signals UPPH1 and SW1 are provided to inputs of finite state machine (FSM) 307. FSM 307 is clocked by current phase clock signal CPM.

Phase detector circuit 304 compares the phase of the next phase clock signal NPM to the phase of the buffered forwarded clock signal FCB to generate two phase detection signals UP2 and DN2. Phase detector circuit 304 asserts the UP2 signal to a logic high state and the DN2 signal to a logic low state each time that a rising edge in the next phase clock signal NPM occurs before a rising edge in the buffered forwarded clock signal FCB. Phase detector circuit 304 asserts the DN2 signal to a logic high state and the UP2 signal to a logic low state each time that a rising edge in the next phase clock signal NPM occurs after a rising edge in the buffered forwarded clock signal FCB.

Phase detection signals UP2 and DN2 are provided to up and down inputs, respectively, of UP/DN counter circuit 306. The current phase clock signal CPM is provided to a clock input of UP/DN counter circuit 306. The UPPH1 signal generated by UP/DN counter circuit 305 is provided to another input of UP/DN counter circuit 306.

UP/DN counter circuit 306 also generates a digital count value. The digital count value of counter circuit 306 has an initial default value of zero after integrated circuit 100 powers up. UP/DN counter circuit 306 increments its digital count value by one in response to each rising edge of clock signal CPM that occurs when the UP2 signal is in a logic high state. UP/DN counter circuit 306 decrements its digital count value by one in response to each rising edge of clock signal CPM that occurs when the DN2 signal is in a logic high state. Alternatively, the digital count value may be incremented or decremented in response to each falling edge of clock signal CPM.

After the digital count value of counter circuit 306 reaches the predefined integer M (e.g., +32), counter circuit 306 resets its digital count value to zero. Also, after the digital count value of counter circuit 306 reaches −M (e.g., −32), counter circuit 306 resets its digital count value to zero.

The digital count value of UP/DN counter circuit 306 reaches −M each time that the phase of the next phase clock signal NPM lags behind the phase of buffered forwarded clock signal FCB during an M number of clock cycles more than the number of clock cycles during which NPM leads FCB. UP/DN counter circuit 306 includes logic circuitry that generates an output signal SETLOCK1 based on its digital count value and based on the UPPH1 signal. The logic circuitry in UP/DN counter circuit 306 generates a logic high pulse in signal SETLOCK1 each time that the digital count value of counter circuit 306 reaches −M (e.g., −32) when the UPPH1 signal is in a logic high state. Thus, a logic high pulse is generated in signal SETLOCK1 each time that the digital count value of counter circuit 306 equals −M concurrently with the UPPH1 signal being in a logic high state.

UP/DN counter circuit 306 generates a logic high pulse in the SETLOCK1 signal when the phase of the current phase clock signal CPM is near the phase of the buffered forwarded clock signal FCB. The SETLOCK1 signal indicates when master DPA circuit 300 has locked the phase of clock signal CPM to the phase of clock signal FCB. After a logic high pulse is generated in the SETLOCK1 signal, the digital count value of counter circuit 306 is reset to zero, and counter circuit 306 adjusts its digital count value based on the UP2 and DN2 signals, as described above. The SETLOCK1 signal is provided to an input of FSM circuit 307.

Figure 4:
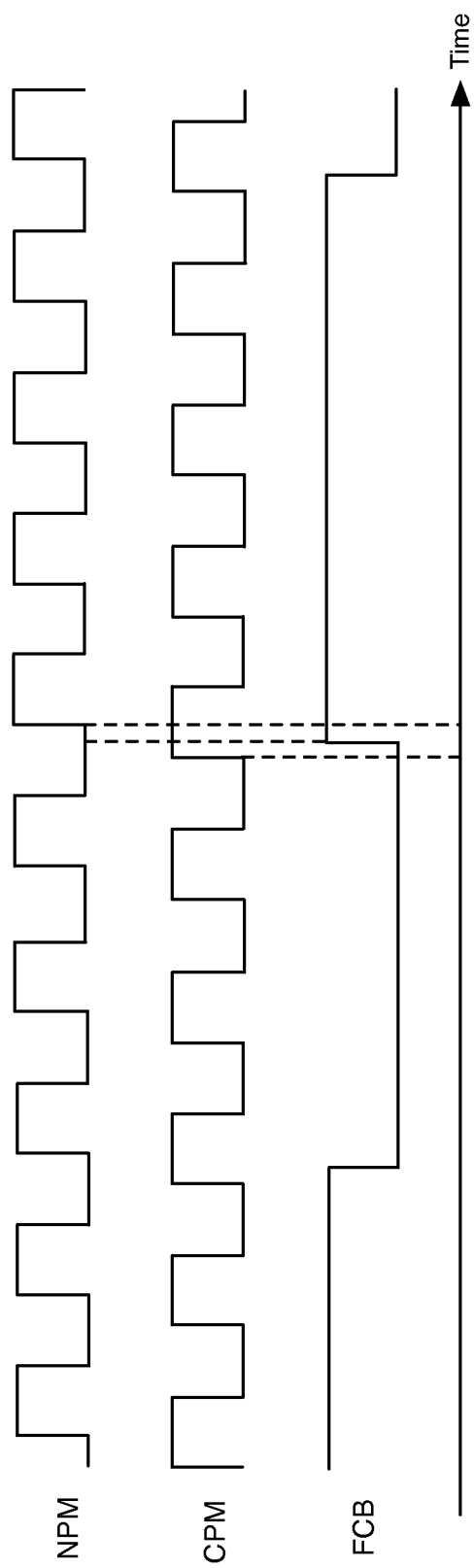
FIG. 4 is a timing diagram that illustrates examples of waveforms of three of the clock signals shown in FIG. 3, according to an embodiment of the present invention.

FIG. 4 is a timing diagram that illustrates examples of waveforms of three of the clock signals shown in FIG. 3, according to an embodiment of the present invention. FIG. 4 illustrates exemplary waveforms for clock signals CPM, NPM, and FCB. In the example shown in FIG. 4, each of the rising edges of the buffered forwarded clock signal FCB occurs after a rising edge of the current phase clock signal CPM and before a rising edge of the next phase clock signal NPM. UP/DN counter circuit 306 generates a logic high pulse in the SETLOCK1 signal after the rising edges of clock signal FCB fall between the rising edges of clock signals CPM and NPM for a net total of M periods of clock signal CPM.

Figure 5:
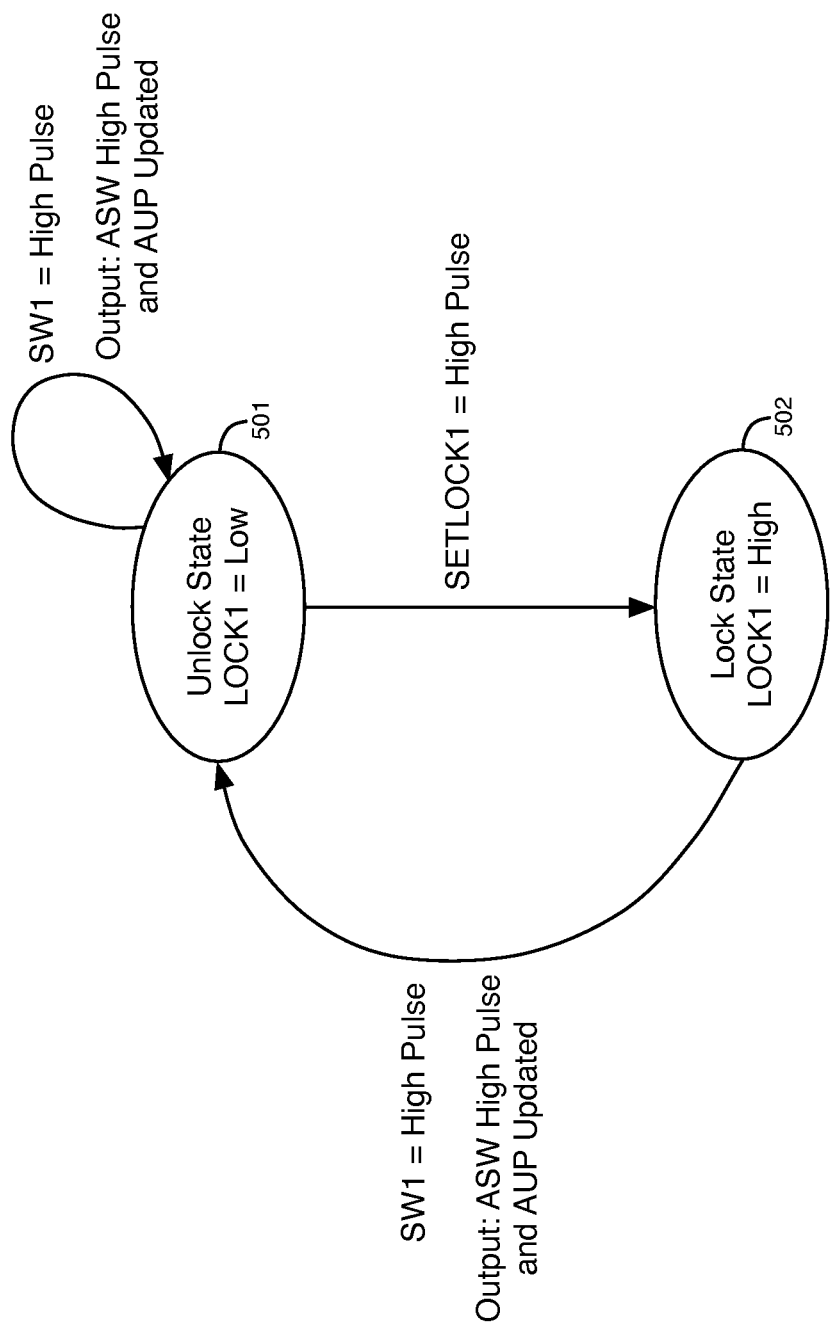
FIG. 5 illustrates a state diagram for the finite state machine (FSM) circuit shown at the bottom of FIG. 3, according to an embodiment of the present invention.

FIG. 5 illustrates a state diagram for the finite state machine (FSM) circuit 307 shown in FIG. 3, according to an embodiment of the present invention. The state diagram of FIG. 5 has an unlock state 501 and a lock state 502. FSM circuit 307 generates a control signal LOCK1, as shown in FIG. 3. The LOCK1 signal indicates whether FSM circuit 307 is in unlock state 501 or lock state 502. The LOCK1 signal may, for example, be provided to circuitry in a core region of integrated circuit 100.

FSM circuit 307 is initially in the unlock state 501, for example, after a reset condition or after integrated circuit 100 powers up. When FSM circuit 307 is in unlock state 501, FSM circuit 307 causes the LOCK1 signal to be in a logic low state. In response to UP/DN counter circuit 306 generating a logic high pulse in the SETLOCK1 signal, FSM circuit 307 transitions from unlock state 501 to lock state 502, as shown in FIG. 5. When FSM circuit 307 is in lock state 502, FSM circuit 307 causes the LOCK1 signal to be in a logic high state. The LOCK1 signal is in a logic high state when the phase of current phase clock signal CPM is aligned or nearly aligned with the phase of buffered forwarded clock signal FCB.

FSM 307 generates output control signals Z1 and Z2 based on control signals UPPH1 and SW1. Control signals Z1-Z2 are provided to inputs of FSM 308. FSM 307 generates control signals AUP and ASW based on control signals UPPH1 and SW1, respectively. FSM 307 causes control signals AUP and ASW to have the same logic states as control signals UPPH1 and SW1, respectively. For example, FSM 307 generates a logic high pulse in control signal ASW in response to receiving a logic high pulse in control signal SW1.

When control signal UPPH1 is in a logic high state, FSM 307 causes control signal AUP to be in a logic high state. When control signal UPPH1 is in a logic low state, FSM 307 causes control signal AUP to be in a logic low state. Control signals AUP and ASW are provided to inputs of each of the slave DPA circuits that are in the same lane as master DPA circuit 300. As an example, control signals AUP and ASW are control signals AUPA and ASWA, respectively, in lane 101 shown in FIG. 2.

The digital count value of UP/DN counter circuit 305 may not reach +M or −M if the phase of clock signal FCB is near the phase of clock signal CPM. UP/DN counter circuit 305 does not generate a logic high pulse in signal SW1, until its digital count value reaches +M or −M. FSM circuit 307 remains in lock state 502 until UP/DN counter circuit 305 generates a logic high pulse in the SW1 signal.

In response to receiving a logic high pulse in the SW1 signal in lock state 502, FSM circuit 307 transitions from lock state 502 to unlock state 501, FSM circuit 307 generates a logic high pulse in signal ASW, FSM circuit 307 causes signal AUP to be in the same logic state as signal UPPH1, and FSM 307 generates a logic high pulse in signal Z1 or Z2. Upon returning to unlock state 501, FSM circuit 307 causes the LOCK1 signal to return to a logic low state.

In response to receiving a logic high pulse in the SW1 signal in unlock state 501, FSM circuit 307 remains in unlock state 501, FSM circuit 307 generates a logic high pulse in signal ASW, FSM circuit 307 causes signal AUP to be in the same logic state as signal UPPH1, and FSM 307 generates a logic high pulse in signal Z1 or Z2. Thus, if signal UPPH1 is in a logic high state when a logic high pulse is generated in signal SW1, then FSM circuit 307 causes signal AUP to be in a logic high state. If signal UPPH1 is in a logic low state when a logic high pulse is generated in signal SW1, then FSM circuit 307 causes signal AUP to be in a logic low state.

In response to each logic high pulse that FSM 307 receives in signal SW1 when signal UPPH1 is in a logic high state, FSM 307 generates a logic high pulse in signal Z1 that indicates to shift the phases of clock signals CPM and NPM to occur later in time. In response to each logic high pulse in signal Z1, FSM 308 adjusts the logic states of select signals CSLM and NSLM to cause multiplexer circuit 302 to shift the phases of clock signals CPM and NPM to occur later in time by 45° by selecting different ones of clock signals CLK1-CLK8. For example, FSM 308 may cause multiplexer circuit 302 to shift the phases of clock signals CPM and NPM from phases of 0° and 45° to phases of 45° and 90°, respectively.

In response to each logic high pulse that FSM 307 receives in signal SW1 when signal UPPH1 is in a logic low state, FSM 307 generates a logic high pulse in signal Z2 that indicates to shift the phases of clock signals CPM and NPM to occur earlier in time. In response to each logic high pulse in signal Z2, FSM 308 adjusts the logic states of select signals CSLM and NSLM to cause multiplexer circuit 302 to shift the phases of clock signals CPM and NPM earlier in time by 45° by selecting different ones of clock signals CLK1-CLK8. For example, FSM 308 may cause multiplexer circuit 302 to shift the phases of clock signals CPM and NPM from phases of 90° and 135° to phases of 45° and 90°, respectively.

FSM 307 maintains the logic states of signals Z1-Z2 constant when a logic high pulse is not generated in signal SW1. FSM 308 maintains the logic states of select signals CSLM and NSLM constant when the logic states of signals Z1-Z2 are constant. Multiplexer circuit 302 maintains clock signals CPM and NPM at the same phases when the logic states of select signals CSLM and NSLM are constant.

Figure 6:
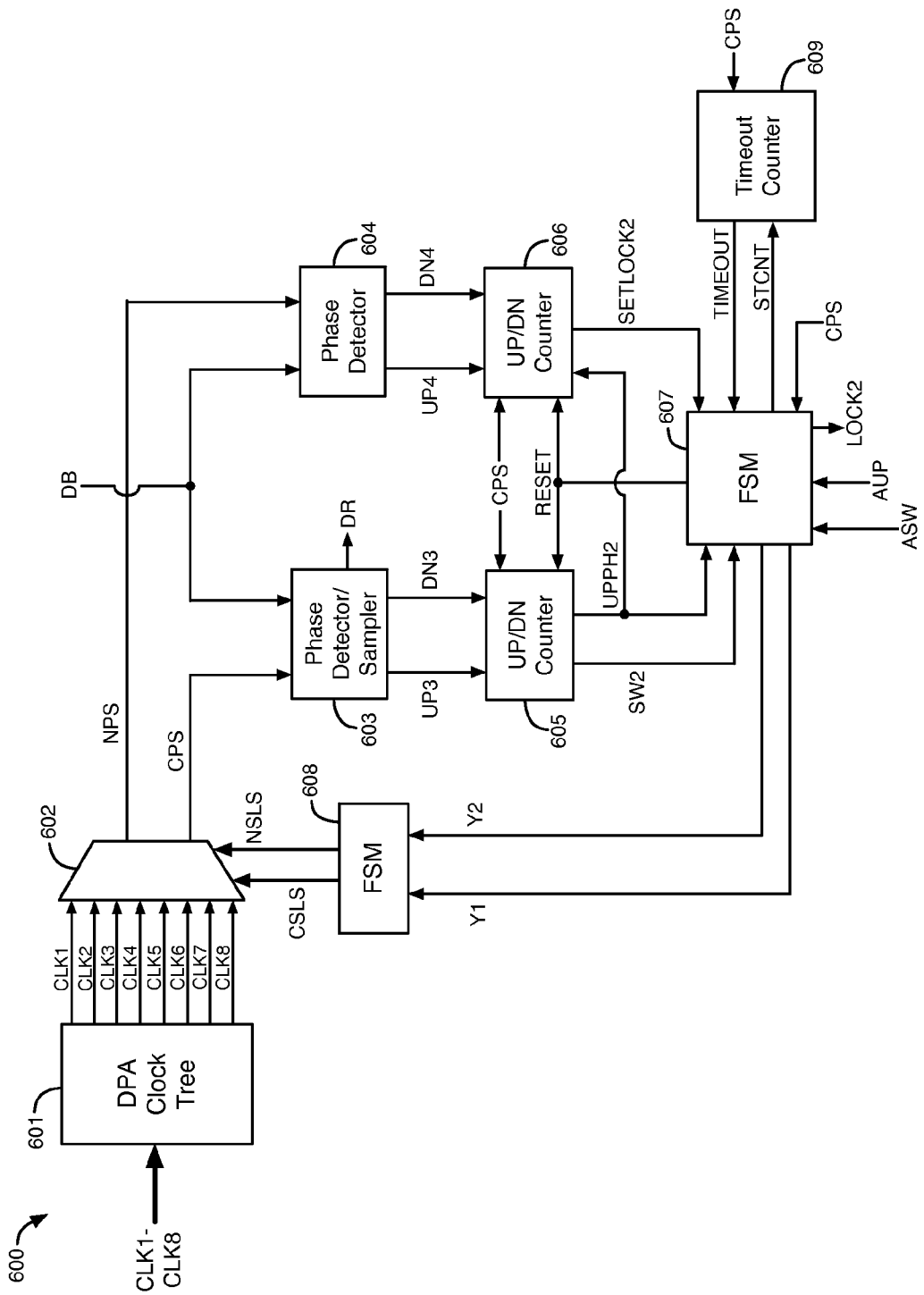
FIG. 6 illustrates an example of a slave dynamic phase alignment (DPA) circuit, according to an embodiment of the present invention.

FIG. 6 illustrates an example of a slave dynamic phase alignment (DPA) circuit 600, according to an embodiment of the present invention. Slave DPA circuit 600 is an example of each of the 5 slave DPA circuits 241-245 shown in FIG. 2. Slave DPA circuit 600 is also an example of the slave DPA circuits in each of the other 7 lanes 102-108 in the interface circuit. In an embodiment, each of the slave DPA circuits in each of the 8 lanes 101-108 has the same circuit structure and functionality of slave DPA circuit 600.

Slave DPA circuit 600 includes DPA clock tree 601, multiplexer circuit 602, phase detector and sampler circuit 603, phase detector circuit 604, up/down (UP/DN) counter circuits 605-606, finite state machine (FSM) circuit 607, FSM circuit 608, and timeout counter circuit 609. The clock signals CLK1-CLK8 generated by PLL circuit 110 are provided to 8 multiplexing inputs of multiplexer circuit 602 through DPA clock tree 601. DPA clock tree 601 includes conductors that provide clock signals CLK1-CLK8 to multiplexer circuit 602. DPA clock tree 601 provides the same delay to each of clock signals CLK1-CLK8. FSM circuits 607-608 and counter circuits 605-606 function as control circuits.

Multiplexer circuit 602 has two multiplexing outputs. Multiplexer circuit 602 outputs a next phase clock signal NPS at its first multiplexing output. Multiplexer circuit 602 outputs a current phase clock signal CPS at its second multiplexing output.

Two digital select signals NSLS are provided to a first set of two select inputs of multiplexer circuit 602. Multiplexer circuit 602 selects one of the 8 clock signals CLK1-CLK8 at its multiplexing inputs as a first selected clock signal based on the digital values of select signals NSLS. Multiplexer circuit 602 provides the first selected clock signal to its first multiplexing output as the next phase clock signal NPS.

Two digital select signals CSLS are provided to a second set of two select inputs of multiplexer circuit 602. Multiplexer circuit 602 selects one of the 8 clock signals CLK1-CLK8 at its multiplexing inputs as a second selected clock signal based on the digital values of select signals CSLS. Multiplexer circuit 602 provides the second selected clock signal to its second multiplexing output as the current phase clock signal CPS.

Finite state machine (FSM) 608 generates select signals NSLS and CSLS. FSM 608 and multiplexer circuit 602 cause the phase of the next phase clock signal NPS to be 45° after the phase of the current phase clock signal CPS. For example, if the current phase clock signal CPS has a phase of 45°, then the next phase clock signal NPS has a phase of 90°.

Slave DPA circuit 600 receives a buffered data signal DB from an input buffer circuit. In slave DPA circuits 241-245, the buffered data signal DB shown in FIG. 6 corresponds to a respective one of buffered data signals DB0A-DB4A shown in FIG. 2. For the slave DPA circuits in lanes 102-108, the buffered data signal DB shown in FIG. 6 is a buffered data signal that is generated from a respective one of data signals DINB-DINH.

Figure 7:
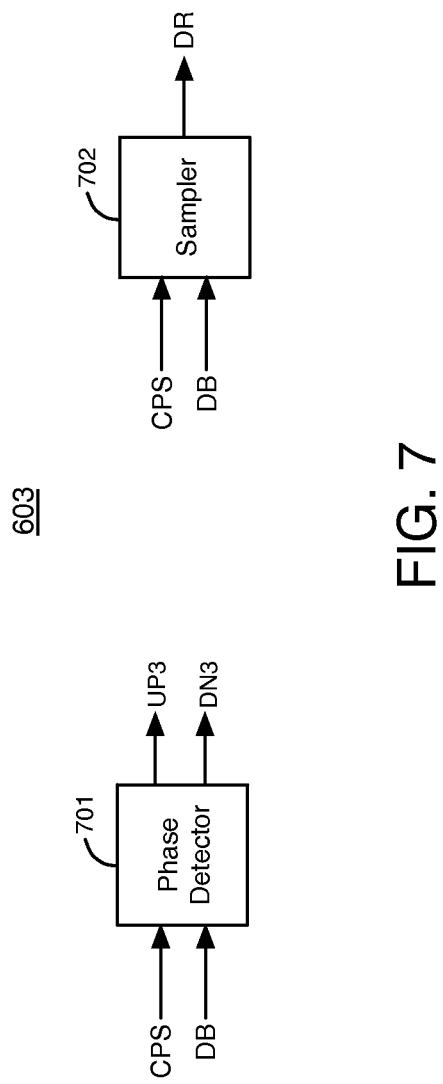
FIG. 7 illustrates a diagram of a phase detector and sampler circuit in the slave DPA circuit of FIG. 6, according to an embodiment of the present invention.

FIG. 7 illustrates a diagram of phase detector and sampler circuit 603 in slave DPA circuit 600, according to an embodiment of the present invention. As shown in FIG. 7, phase detector and sampler circuit 603 includes phase detector circuit 701 and sampler circuit 702. The current phase clock signal CPS and the buffered data signal DB are provided to inputs of phase detector circuit 701 and to inputs of sampler circuit 702. Sampler circuit 702 captures the value of the buffered data signal DB in response to current phase clock signal CPS. Sampler circuit 702 provides the captured value of the buffered data signal DB to its output in a retimed digital data signal DR. As an example, sampler circuit 702 may include one or more flip-flop circuits or another type of storage circuit.

Phase detector circuit 701 compares the phase of the current phase clock signal CPS to the phase of the buffered data signal DB to generate two phase detection signals UP3 and DN3. Phase detector circuit 701 causes the UP3 signal to be in a logic high state and the DN3 signal to be in a logic low state each time that a rising edge in the current phase clock signal CPS occurs before a rising edge in the buffered data signal DB. Phase detector circuit 701 causes the DN3 signal to be in a logic high state and the UP3 signal to be in a logic low state each time that a rising edge in the current phase clock signal CPS occurs after a rising edge in the buffered data signal DB. Phase detector circuit 701 causes the UP3 signal and the DN3 signal to both be in logic low states when rising edges do not occur in buffered data signal DB.

Referring to FIG. 6, phase detection signals UP3 and DN3 are provided to up and down inputs, respectively, of UP/DN counter circuit 605. The current phase clock signal CPS is provided to a clock input of UP/DN counter circuit 605. A RESET signal is provided to a reset input of UP/DN counter circuit 605.

UP/DN counter circuit 605 generates a digital count value. The digital count value of counter circuit 605 has an initial default value of zero after integrated circuit 100 powers up. The digital count value of counter circuit 605 is reset to zero in response to each logic high pulse generated in the RESET signal.

UP/DN counter circuit 605 increments its digital count value by one in response to each rising edge of clock signal CPS that occurs when the UP3 signal is in a logic high state. UP/DN counter circuit 605 decrements its digital count value by one in response to each rising edge of clock signal CPS that occurs when the DN3 signal is in a logic high state. Alternatively, the digital count value may be incremented or decremented in response to each falling edge of clock signal CPS. UP/DN counter circuit 605 maintains its digital count value constant while the UP3 signal and the DN3 signal are both in logic low states.

UP/DN counter circuit 605 generates two digital output signals UPPH2 and SW2 based on its digital count value. UP/DN counter circuit 605 includes logic circuitry that causes the UPPH2 signal to be in a logic high state when the digital count value of UP/DN counter circuit 605 is greater than 0. The logic circuitry in UP/DN counter circuit 605 causes the UPPH2 signal to be in a logic low state when the digital count value of UP/DN counter circuit 605 is 0 or less than 0.

UP/DN counter circuit 605 generates a logic high pulse in signal SW2 each time that the phase of the current phase clock signal CPS is leading the phase of buffered data signal DB during a predefined number M of clock cycles more than the number of clock cycles during which CPS is lagging behind DB. UP/DN counter circuit 605 generates a logic high pulse in signal SW2 each time that the phase of the current phase clock signal CPS is lagging behind the phase of buffered data signal DB during an M number of clock cycles more than the number of clock cycles during which CPS is leading DB.

The logic circuitry in UP/DN counter circuit 605 generates a logic high pulse in signal SW2 each time that the digital count value of UP/DN counter circuit 605 reaches M or −M. According to an exemplary embodiment, the logic circuitry in UP/DN counter circuit 605 generates a logic high pulse in signal SW2 each time that the digital count value of UP/DN counter circuit 605 reaches +32 or −32 (i.e., M=32). After the digital count value of counter circuit 605 reaches M (e.g., +32), counter circuit 605 resets its digital count value to zero. Also, after the digital count value of counter circuit 605 reaches −M (e.g., −32), counter circuit 605 resets its digital count value to zero.

Phase detector circuit 604 compares the phase of the next phase clock signal NPS to the phase of the buffered data signal DB to generate two phase detection signals UP4 and DN4. Phase detector circuit 604 asserts the UP4 signal to a logic high state and the DN4 signal to a logic low state each time that a rising edge in the next phase clock signal NPS occurs before a rising edge in the buffered data signal DB. Phase detector circuit 604 asserts the DN4 signal to a logic high state and the UP4 signal to a logic low state each time that a rising edge in the next phase clock signal NPS occurs after a rising edge in the buffered data signal DB. Phase detector circuit 604 causes the UP4 signal and the DN4 signal to both be in logic low states when rising edges do not occur in buffered data signal DB.

Phase detection signals UP4 and DN4 are provided to up and down inputs, respectively, of UP/DN counter circuit 606. The current phase clock signal CPS is provided to a clock input of UP/DN counter circuit 606. The UPPH2 signal generated by UP/DN counter circuit 605 is provided to another input of UP/DN counter circuit 606. The RESET signal is provided to a reset input of UP/DN counter circuit 606.

UP/DN counter circuit 606 also generates a digital count value. The digital count value of counter circuit 606 has an initial default value of zero after integrated circuit 100 powers up. UP/DN counter circuit 606 increments its digital count value by one in response to each rising edge of clock signal CPS that occurs when the UP4 signal is in a logic high state. UP/DN counter circuit 606 decrements its digital count value by one in response to each rising edge of clock signal CPS that occurs when the DN4 signal is in a logic high state. Alternatively, the digital count value of counter 606 may be incremented or decremented in response to each falling edge of clock signal CPS. UP/DN counter circuit 606 maintains its digital count value constant while the UP4 signal and the DN4 signal are both in logic low states.

After the digital count value of counter circuit 606 reaches the predefined integer M (e.g., +32), counter circuit 606 resets its digital count value to zero. Also, after the digital count value of counter circuit 606 reaches −M (e.g., −32), counter circuit 606 resets its digital count value to zero. The digital count value of counter circuit 606 is reset to zero in response to each logic high pulse generated in the RESET signal.

FIG. 8A is a timing diagram that illustrates examples of waveforms of three of the signals shown in FIG. 6, according to an embodiment of the present invention. FIG. 8A illustrates exemplary waveforms for signals CPS, NPS, and DB. In the example shown in FIG. 8A, the buffered data signal DB contains a repeating pattern of logic high (1) and logic low (0) bits (i.e., 10101010 . . . ), and the bits in the buffered data signal DB occur at a single data rate relative to clock signals CLK1-CLK8.

In FIG. 8A, the rising edges of the buffered data signal DB occur after the rising edges of the current phase clock signal CPS and before the rising edges of next phase clock signal NPS, as shown by the dotted lines. When the rising edges of the buffered data signal DB occur after the rising edges of clock signal CPS and before the rising edges of clock signal NPS in a single data rate embodiment, the falling edges of clock signal CPS occur near the centers of the sampling windows of the bits in data signal DB, as shown by the dotted arrows in FIG. 8A. Therefore, in a single data rate embodiment, sampler circuit 702 captures the value of the buffered data signal DB in response to each falling edge in the current phase clock signal CPS.

Referring again to FIG. 6, the digital count value of UP/DN counter circuit 606 reaches −M each time that the phase of the next phase clock signal NPS lags behind the phase of buffered data signal DB during an M number of clock cycles more than the number of clock cycles during which NPS leads DB. UP/DN counter circuit 606 includes logic circuitry that generates an output signal SETLOCK2 based on its digital count value and based on the UPPH2 signal. The logic circuitry in UP/DN counter circuit 606 generates a logic high pulse in signal SETLOCK2 each time that the digital count value of counter circuit 606 reaches −M (e.g., −32) when the UPPH2 signal is in a logic high state. Thus, a logic high pulse is generated in signal SETLOCK2 each time that the digital count value of counter circuit 606 equals −M concurrently with the UPPH2 signal being in a logic high state.

UP/DN counter circuit 606 generates a logic high pulse in the SETLOCK2 signal when the phase of the current phase clock signal CPS is at or near the phase of the buffered data signal DB. The SETLOCK2 signal indicates when slave DPA circuit 600 has locked the phase of clock signal CPS to the phase of data signal DB. After a logic high pulse is generated in the SETLOCK2 signal, the digital count value of counter circuit 606 is reset to zero, and counter circuit 606 adjusts its digital count value based on the UP4 and DN4 signals, as described above.

Each of the slave DPA circuits in the interface circuit tracks edge transitions in its respective input data signal in order to maintain sufficient bit margin, as described above with respect to FIG. 6. However, some specifications for the transmission of video data signals do not guarantee edge transitions in the video data signals.

FIG. 8B is a timing diagram that illustrates examples of waveforms of signals CPS, NPS, and DB shown in FIG. 6, according to another embodiment of the present invention. In FIG. 8B, the buffered data signal DB contains a series of logic low (0) bits (i.e., 00000 . . . ), and the bits in the buffered data signal DB occur at a single data rate relative to clock signals CLK1-CLK8. When buffered data signal DB has a series of logic low bits, slave DPA circuit 600 cannot align the current phase clock signal CPS to edge transitions in buffered data signal DB. Slave DPA circuit 600 can only track edge transitions in buffered data signal DB when buffered data signal DB has a sufficient number of edge transitions.

Slave DPA circuit 600 uses control signals AUP and ASW to adjust the phase of the current phase clock signal CPS to be near the start of the bit periods in the buffered data signal DB when there is not a sufficient number of edge transitions in buffered data signal DB. Each of the slave DPA circuits in a particular lane adjusts the phase of its respective current phase clock signal to be near the start of the bit periods in its respective buffered data signal in response to the control signals AUP and ASW generated by the master DPA circuit in the same lane.

Control signals AUP and ASW are provided to inputs of finite state machine (FSM) 607 from master DPA circuit 300. The SETLOCK2 signal and control signals UPPH2 and SW2 are provided to additional inputs of FSM 607. FSM 607 is clocked by current phase clock signal CPS.

Figure 9:
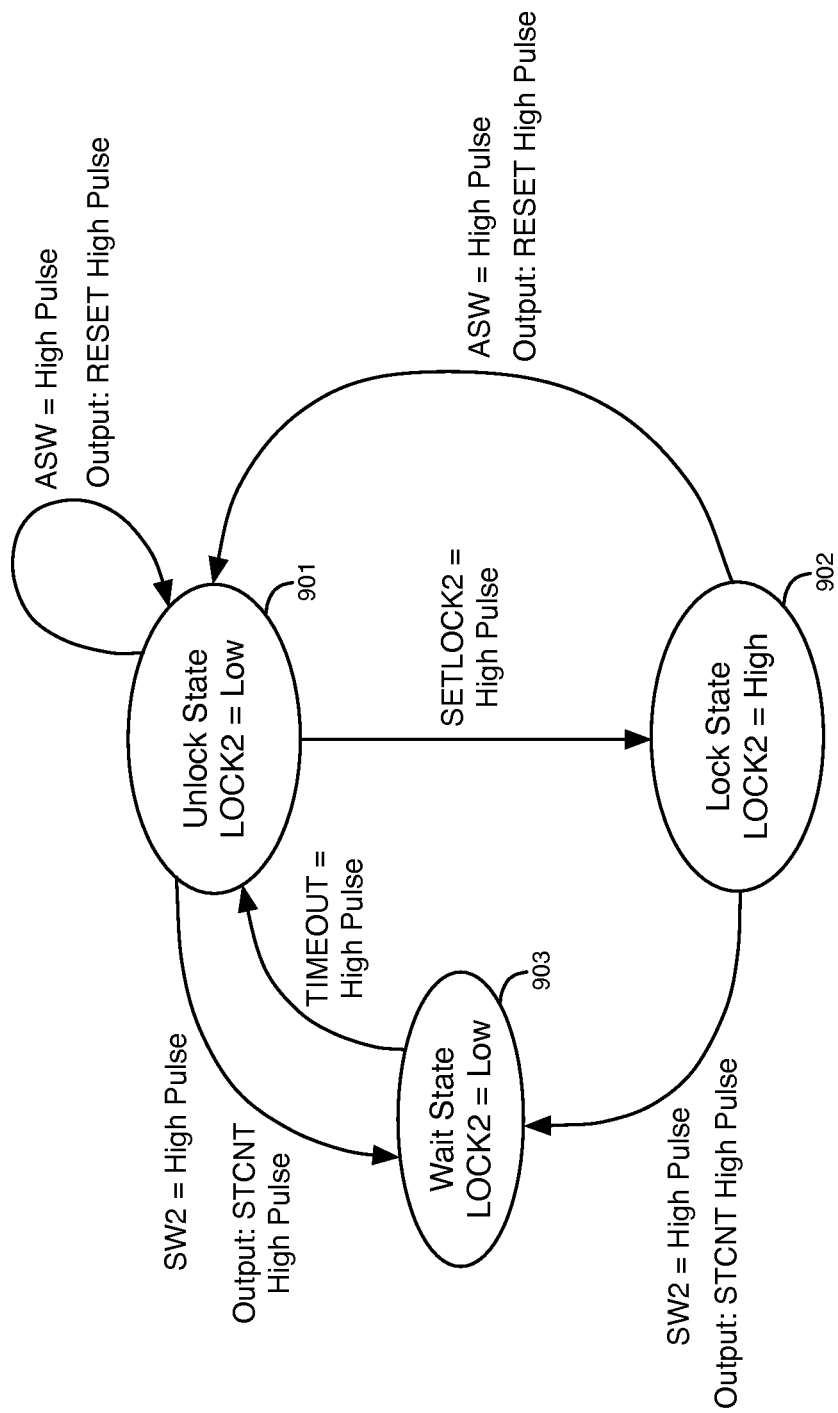
FIG. 9 illustrates a state diagram for the finite state machine (FSM) circuit shown at the bottom of FIG. 6, according to an embodiment of the present invention.

FIG. 9 illustrates a state diagram for the finite state machine (FSM) circuit 607 of FIG. 6, according to an embodiment of the present invention. The state diagram of FIG. 9 has an unlock state 901, a lock state 902, and a wait state 903. FSM circuit 607 generates control signals LOCK2 and STCNT, as shown in FIG. 6. The LOCK2 signal indicates if FSM circuit 607 is in lock state 902. The LOCK2 signal may, for example, be provided to circuitry in a core region of integrated circuit 100.

FSM circuit 607 is initially in unlock state 901, for example, after a reset condition or after integrated circuit 100 powers up. When FSM circuit 607 is in unlock state 901, FSM circuit 607 causes the LOCK2 signal to be in a logic low state. In response to UP/DN counter circuit 606 generating a logic high pulse in the SETLOCK2 signal, FSM circuit 607 transitions from unlock state 901 to lock state 902, as shown in FIG. 9. When FSM circuit 607 is in lock state 902, FSM circuit 607 causes the LOCK2 signal to be in a logic high state. The LOCK2 signal is in a logic high state when the phase of current phase clock signal CPS is aligned or nearly aligned with the phase of buffered data signal DB within a bit margin. As an example that is not intended to be limiting, the bit margin may be ⅛ of a bit period of buffered data signal DB.

FSM 607 generates digital output control signals Y1 and Y2 based on control signals UPPH2, SW2, AUP, and ASW. Control signals Y1-Y2 are provided to inputs of FSM 608. If FSM 607 receives a logic high pulse in signal SW2 before receiving a logic high pulse in signal ASW while in state 901 or 902, then FSM 607 generates a logic high pulse in signal STCNT, and FSM 607 generates a logic high pulse in signal Y1 or Y2. Subsequently, FSM 607 transitions to wait state 903. In wait state 903, FSM 607 causes the LOCK2 signal to be in a logic low state. FSM 607 does not respond to signal ASW or signal SW2 while in wait state 903. Thus, FSM 607 does not generate a logic high pulse in either of signals Y1 or Y2 in response to a logic pulse in either of signals ASW or SW2 while FSM 607 is in wait state 903.

In response to each logic high pulse that FSM 607 receives in signal SW2 while FSM 607 is in unlock state 901 or lock state 902 (before receiving a logic high pulse in signal ASW) when signal UPPH2 is in a logic high state, FSM 607 generates a logic high pulse in control signal Y1. In response to each logic high pulse that FSM 607 receives in signal SW2 while FSM 607 is in unlock state 901 or lock state 902 (before receiving a logic high pulse in signal ASW) when signal UPPH2 is in a logic low state, FSM 607 generates a logic high pulse in control signal Y2. FSM 607 does not generate a logic high pulse in either signal Y1 or signal Y2 in response to a logic high pulse in signal SW2 when FSM 607 is in wait state 903.

Each logic high pulse that FSM 607 generates in signal Y1 indicates to shift the phases of clock signals CPS and NPS later in time. In response to each logic high pulse in signal Y1, FSM 608 adjusts the logic states of select signals CSLS and NSLS to cause multiplexer circuit 602 to shift the phases of clock signals CPS and NPS to occur later in time by 45° by selecting different ones of clock signals CLK1-CLK8. For example, FSM 608 may cause multiplexer circuit 602 to shift the phases of clock signals CPS and NPS from phases of 45° and 90° to phases of 90° and 135°, respectively.

Each logic high pulse that FSM 607 generates in signal Y2 indicates to shift the phases of clock signals CPS and NPS earlier in time. In response to each logic high pulse in signal Y2, FSM 608 adjusts the logic states of select signals CSLS and NSLS to cause multiplexer circuit 602 to shift the phases of clock signals CPS and NPS earlier in time by 45° by selecting different ones of clock signals CLK1-CLK8. For example, FSM 608 may cause multiplexer circuit 602 to shift the phases of clock signals CPS and NPS from phases of 135° and 180° to phases of 90° and 135°, respectively.

FSM 607 maintains the logic states of control signals Y1-Y2 constant when signals SW2 and ASW are in constant logic states while FSM 607 is in unlock state 901 or in lock state 902. FSM 607 also maintains the logic states of control signals Y1-Y2 constant while FSM 607 is in wait state 903. FSM 608 maintains the logic states of select signals CSLS and NSLS constant when the logic states of control signals Y1-Y2 are constant. Multiplexer circuit 602 maintains clock signals CPS and NPS at the same phases when the logic states of select signals CSLS and NSLS are constant.

As stated above, if FSM 607 receives a logic high pulse in signal SW2 while in unlock state 901 or in lock state 902 before receiving a logic high pulse in signal ASW, FSM 607 generates a logic high pulse in signal STCNT. Signal STCNT is provided to an input of timeout counter circuit 609. Timeout counter circuit 609 begins a timeout period in response to each logic high pulse in signal STCNT. For example, timeout counter circuit 609 may increment its digital count value by one in each period of clock signal CPS following a logic high pulse in signal STCNT. Alternatively, timeout counter circuit 609 may decrement its digital count value by one in each period of clock signal CPS following a logic high pulse in signal STCNT.

When the digital count value of timeout counter circuit 609 reaches a predetermined value selected to indicate that the timeout period is over, timeout counter circuit 609 generates a logic high pulse in its output signal TIMEOUT. The TIMEOUT signal is provided to an input of FSM 607. When FSM 607 receives a logic high pulse in the TIMEOUT signal, FSM 607 transitions from wait state 903 to unlock state 901. In unlock state 901, FSM 607 is responsive to logic pulses in signals ASW and SW2. The timeout period and the predetermined value of counter 609 may be programmable values. As an example that is not intended to be limiting, the timeout period may be set to the minimum number of clock cycles that FSM 307 takes to determine if signal ASW will be asserted.

If FSM 607 receives a logic high pulse in signal ASW while in lock state 902 before receiving a logic high pulse in signal SW2, then FSM 607 generates a logic high pulse in signal RESET, FSM 607 generates a logic high pulse in control signal Y1 or Y2, and FSM 607 transitions to unlock state 901, as shown in FIG. 9. In response to each logic high pulse in the RESET signal, the digital count values of UP/DN counter circuits 605 and 606 are both reset to zero. If FSM 607 receives a logic high pulse in signal ASW while in unlock state 901, FSM 607 generates a logic high pulse in signal RESET, FSM 607 generates a logic high pulse in control signal Y1 or Y2, the digital count values of UP/DN counter circuits 605-606 are reset to zero, and FSM 607 remains in unlock state 901, as shown in FIG. 9.

By resetting the digital count values of UP/DN counter circuits 605-606 to zero after FSM 607 receives a logic high pulse in signal ASW while in state 901 or 902, slave DPA circuit 600 prevents a logic high pulse in signal SW2 occurring less than an M number of periods of clock signal CPS after a logic high pulse in signal ASW. As a result, slave DPA circuit 600 prevents overcorrection in the phases of clock signals CPS and NPS that would be caused by adjusting the phases of clock signals CPS and NPS based on signal SW2 before an adjustment to their phases based on signal ASW has been reflected in the digital count value of counter circuit 605.

FSM 607 generates a logic high pulse in control signal Y1 or Y2 each time that a logic high pulse is generated in control signal ASW and FSM 607 is in lock state 902 or unlock state 901. FSM 607 does not generate a logic high pulse in control signal Y1 or Y2 in response to a logic transition or logic pulse in control signal ASW when FSM 607 is in wait state 903. If FSM 607 receives a logic pulse in signal ASW after receiving a logic pulse in signal SW2 during the timeout period of timeout counter 609, FSM 607 does not generate a logic pulse in signal Y1 or Y2 in response to the logic pulse in signal ASW. By not responding to transitions in signal ASW during wait state 903, FSM 607 prevents slave DPA circuit 600 from overcorrecting the phase of the current phase clock signal CPS.

In response to each logic high pulse that FSM 607 receives in signal ASW when signal AUP is in a logic high state and FSM 607 is in unlock state 901 or lock state 902, FSM 607 generates a logic high pulse in control signal Y1. As stated above, each logic high pulse in the Y1 signal causes slave DPA circuit 600 to shift the phases of clock signals CPS and NPS later in time. In response to each logic high pulse that FSM 607 receives in signal ASW when signal AUP is in a logic low state and FSM 607 is in unlock state 901 or lock state 902, FSM 607 generates a logic high pulse in control signal Y2. As stated above, each logic high pulse in the Y2 signal causes slave DPA circuit 600 to shift the phases of clock signals CPS and NPS earlier in time.

When there are not a sufficient number of edge transitions in buffered data signal DB for the digital count value of UP/DN counter circuit 605 to reach M or −M, slave DPA circuit 600 adjusts the phase of its current phase clock signal CPS based on the control signals ASW and AUP generated by the master DPA circuit 300 in the same lane. The control signals ASW and AUP generated by the master DPA circuit 300 provide phase adjustment information to each of the slave DPA circuits 600 in the same lane to allow the slave DPA circuits in that lane to align their current phase clock signals to their respective buffered data signals. The slave DPA circuits in the lane align their current phase clock signals to their respective buffered data signals based on control signals ASW and AUP when there are not a sufficient number of edge transitions in their respective buffered data signals. The master DPA circuit 300 generates the phase adjustment information indicated by control signals ASW and AUP based on the forwarded clock signal transmitted to that lane, as described above. The forwarded clock signal transmitted to a lane is a consistent and accurate proxy for any phase and timing changes in the edge transitions in each of the input data signals transmitted to that lane.

Figure 10:
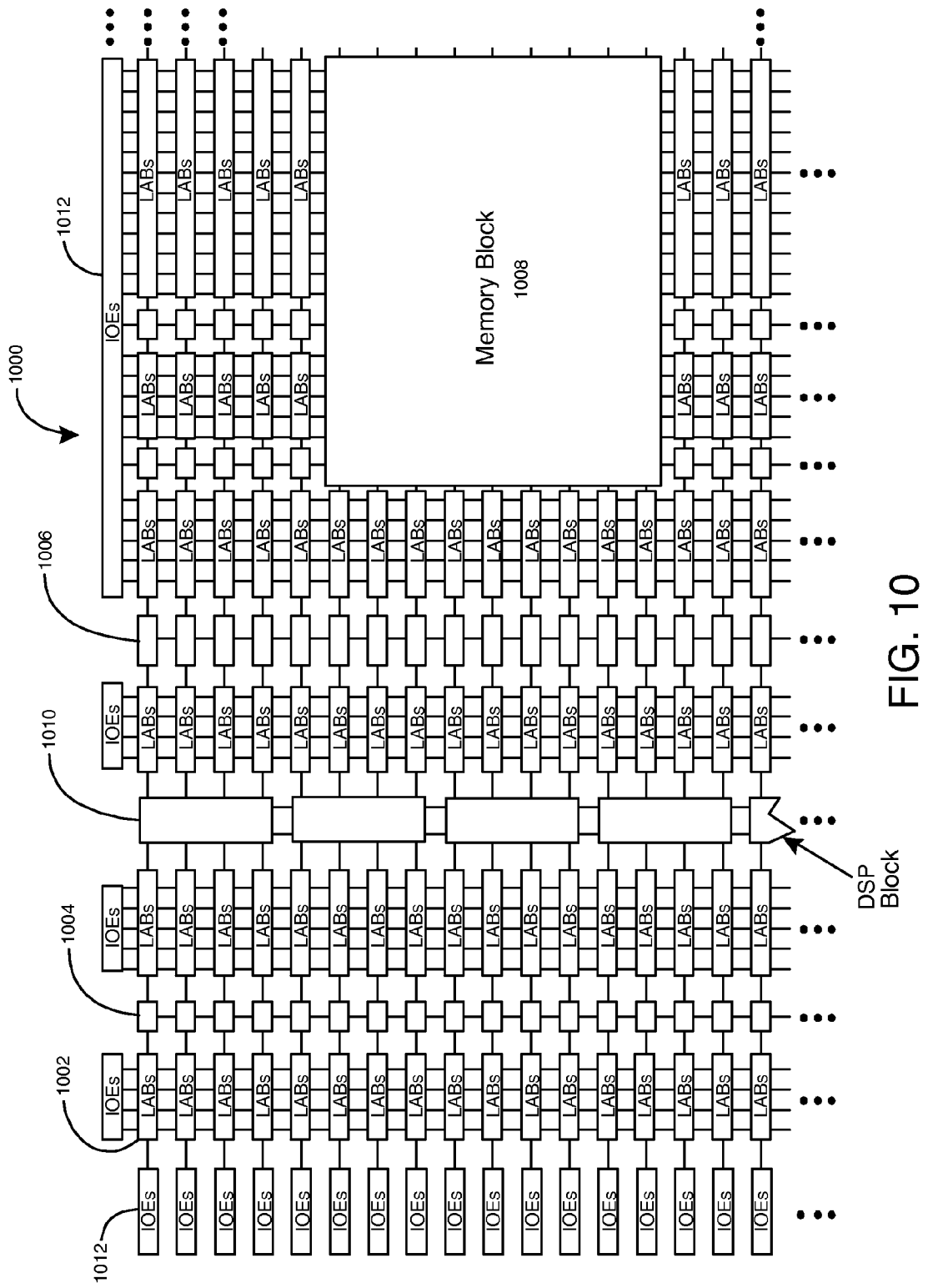
FIG. 10 is a simplified partial block diagram of a field programmable gate array (FPGA) integrated circuit that can include aspects of the present invention.

FIG. 10 is a simplified partial block diagram of a field programmable gate array (FPGA) 1000 that can include aspects of the present invention. FPGA 1000 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 1000 includes a two-dimensional array of programmable logic array blocks (or LABs) 1002 that are interconnected by a network of column and row interconnect conductors of varying length and speed. LABs 1002 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 1000 also includes a distributed memory structure including random access memory (RAM) blocks of varying sizes provided throughout the array. The RAM blocks include, for example, blocks 1004, blocks 1006, and block 1008. These memory blocks can also include shift registers and first-in-first-out (FIFO) buffers.

FPGA 1000 further includes digital signal processing (DSP) blocks 1010 that can implement, for example, multipliers with add or subtract features. Input/output elements (IOEs) 1012 support numerous single-ended and differential input/output standards. IOEs 1012 include input and output buffers that are coupled to pins of the integrated circuit. The pins are external terminals of the FPGA die that can be used to route, for example, input signals, output signals, and supply voltages between the FPGA and one or more external devices. FPGA 1000 may also include the interface circuit having lanes 101-108 shown in FIG. 1. FPGA 1000 is described herein for illustrative purposes. Embodiments of the present invention can be implemented in many different types of integrated circuits.

Figure 11:
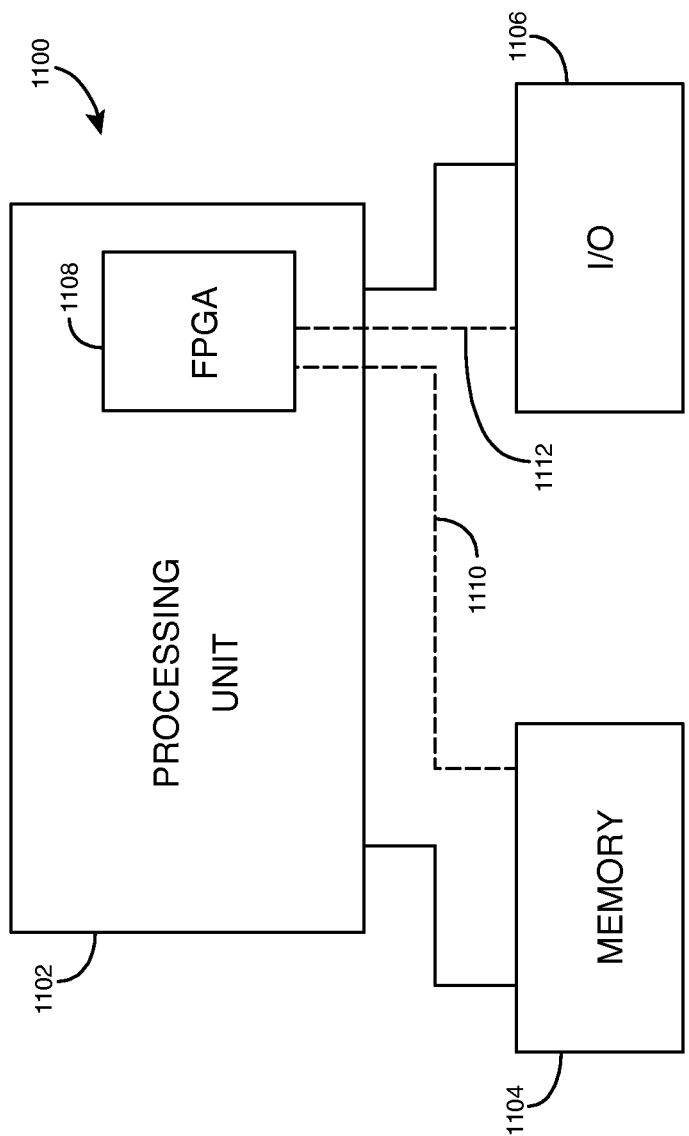
FIG. 11 shows a block diagram of an exemplary digital system that can embody techniques of the present invention.

The present invention can also be implemented in a system that has an FPGA as one of several components. FIG. 11 shows a block diagram of an exemplary digital system 1100 that can embody techniques of the present invention. System 1100 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1100 can be provided on a single board, on multiple boards, or within multiple enclosures.

System 1100 includes a processing unit 1102, a memory unit 1104, and an input/output (I/O) unit 1106 interconnected together by one or more buses. According to this exemplary embodiment, an FPGA 1108 is embedded in processing unit 1102. FPGA 1108 can serve many different purposes within the system of FIG. 11. FPGA 1108 can, for example, be a logical building block of processing unit 1102, supporting its internal and external operations. FPGA 1108 is programmed to implement the logical functions necessary to carry on its particular role in system operation. FPGA 1108 can be specially coupled to memory 1104 through connection 1110 and to I/O unit 1106 through connection 1112.

Processing unit 1102 can direct data to an appropriate system component for processing or storage, execute a program stored in memory 1104, receive and transmit data via I/O unit 1106, or other similar functions. Processing unit 1102 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1108 can control the logical operations of the system. As another example, FPGA 1108 acts as a reconfigurable processor that can be reprogrammed as needed to handle a particular computing task. Alternatively, FPGA 1108 can itself include an embedded microprocessor. Memory unit 1104 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a first phase alignment circuit to generate an indication of a phase of a first clock signal; and
   a second phase alignment circuit to adjust a phase of a second clock signal based on a first data signal, wherein the second phase alignment circuit adjusts the phase of the second clock signal based on the indication of the phase of the first clock signal,
   wherein the second phase alignment circuit resets an indication of the phase of the second clock signal generated based on the first data signal in response to the indication of the phase of the first clock signal, and wherein the second phase alignment circuit captures a value of the first data signal in response to the second clock signal.

2. The circuit of claim 1, wherein the circuit is an interface circuit in an integrated circuit, and wherein the first clock signal and the first data signal are transmitted to the integrated circuit from a device external to the integrated circuit.

3. The circuit of claim 1, wherein the second phase alignment circuit comprises a control circuit that prevents an adjustment to the phase of the second clock signal based on receiving the indication of the phase of the first clock signal within a predefined period after an indication to adjust the phase of the second clock signal based on the first data signal.

4. The circuit of claim 3, wherein the second phase alignment circuit further comprises first and second counter circuits, wherein the first counter circuit generates the indication to adjust the phase of the second clock signal based on a phase comparison between the first data signal and the second clock signal, and wherein the second counter circuit indicates the predefined period.

5. The circuit of claim 1, wherein the second phase alignment circuit comprises a counter circuit to generate a digital count value embodying the indication of the phase of the second clock signal, and wherein the second phase alignment circuit resets the digital count value of the counter circuit in response to the indication of the phase of the first clock signal.

6. The circuit of claim 1, wherein the second phase alignment circuit generates the indication of the phase of the second clock signal based on a phase comparison between the second clock signal and the first data signal, and wherein the second phase alignment circuit generates an indication to adjust the phase of the second clock signal based on the indication of the phase of the second clock signal.

7. The circuit of claim 1, further comprising:
   a third phase alignment circuit to adjust a phase of a third clock signal based on a second data signal,
   wherein the third phase alignment circuit captures a value of the second data signal in response to the third clock signal, and wherein the third phase alignment circuit adjusts the phase of the third clock signal based on the indication of the phase of the first clock signal.

8. The circuit of claim 1, wherein the first phase alignment circuit generates an indication to adjust the phase of a third clock signal based on a phase comparison between the first clock signal and the third clock signal, and wherein the indication of the phase of the first clock signal is a control signal generated based on the indication to adjust the phase of the third clock signal.

9. A circuit comprising:
   a first phase detector circuit to compare a phase of a first clock signal to a phase of a second clock signal to generate a first phase detection signal;
   a first control circuit to generate an indication to adjust the phase of the second clock signal based on the first phase detection signal;
   a first multiplexer circuit to adjust the phase of the second clock signal based on the indication to adjust the phase of the second clock signal;
   a second phase detector circuit to compare a phase of a third clock signal to a first data signal to generate a second phase detection signal;
   a second control circuit to generate an indication to adjust the phase of the third clock signal based on the second phase detection signal; and a second multiplexer circuit to adjust the phase of the third clock signal based on the indication to adjust the phase of the third clock signal and based on the indication to adjust the phase of the second clock signal.

10. The circuit of claim 9, wherein the second control circuit prevents an adjustment to the phase of the third clock signal based on the indication to adjust the phase of the second clock signal within a timeout period after a phase shift provided to the third clock signal based on the indication to adjust the phase of the third clock signal, and wherein the circuit further comprises a counter circuit that controls the timeout period.

11. The circuit of claim 9 further comprising:
a sampler circuit to capture a value of the first data signal in response to the third clock signal.

12. The circuit of claim 9, wherein the second control circuit comprises a counter circuit to generate a digital count value embodying an indication of the phase of the third clock signal, wherein the counter circuit adjusts the digital count value based on the second phase detection signal, and wherein the second control circuit resets the digital count value of the counter circuit in response to the indication to adjust the phase of the second clock signal.

13. The circuit of claim 9, wherein the circuit is an interface circuit in an integrated circuit, and wherein the first clock signal and the first data signal are transmitted to the interface circuit from a device external to the integrated circuit.

14. The circuit of claim 9 further comprising:
a third phase detector circuit to compare a phase of a fourth clock signal to a second data signal to generate a third phase detection signal;
a third control circuit to generate an indication to adjust the phase of the fourth clock signal based on the third phase detection signal; and
a third multiplexer circuit to adjust the phase of the fourth clock signal based on the indication to adjust the phase of the fourth clock signal and based on the indication to adjust the phase of the second clock signal.

15. The circuit of claim 9, further comprising:
a third phase detector circuit to compare a phase of a fourth clock signal to the first data signal to generate a third phase detection signal,
wherein the second control circuit generates an indication when the third clock signal is aligned with the first data signal within a bit margin based on the third phase detection signal,
wherein the second multiplexer circuit outputs the third and the fourth clock signals, and wherein the second multiplexer circuit adjusts the phase of the fourth clock signal based on the indication to adjust the phase of the third clock signal and based on the indication to adjust the phase of the second clock signal.

16. A method comprising:
generating an indication of a phase of a first clock signal with a first phase alignment circuit;
adjusting a phase of a second clock signal based on a first data signal with a second phase alignment circuit;
adjusting the phase of the second clock signal based on the indication of the phase of the first clock signal with the second phase alignment circuit;
resetting an indication of the phase of the second clock signal generated based on the first data signal in response to the indication of the phase of the first clock signal; and
capturing a value of the first data signal in response to the second clock signal with the second phase alignment circuit.

17. The method of claim 16, further comprising:
preventing an adjustment to the phase of the second clock signal based on receiving the indication of the phase of the first clock signal within a predefined period after an indication to adjust the phase of the second clock signal based on the first data signal; and
measuring the predefined period using a counter circuit.

18. The method of claim 16, further comprising:
generating a digital count value embodying the indication of the phase of the second clock signal with a counter circuit in the second phase alignment circuit,
wherein resetting the indication of the phase of the second clock signal generated based on the first data signal in response to the indication of the phase of the first clock signal comprises resetting the digital count value of the counter circuit in response to the indication of the phase of the first clock signal.

19. A method comprising:
comparing a phase of a first clock signal to a phase of a second clock signal to generate a first phase detection signal with a first phase detector;
generating an indication to adjust the phase of the second clock signal based on the first phase detection signal with a first control circuit;
adjusting the phase of the second clock signal with a first multiplexer based on the indication to adjust the phase of the second clock signal;
comparing a phase of a third clock signal to a data signal to generate a second phase detection signal with a second phase detector;
generating an indication to adjust the phase of the third clock signal based on the second phase detection signal with a second control circuit; and
adjusting the phase of the third clock signal with a second multiplexer based on the indication to adjust the phase of the third clock signal and based on the indication to adjust the phase of the second clock signal.

20. The method of claim 19 further comprising:
comparing a phase of a fourth clock signal to the data signal to generate a third phase detection signal with a third phase detector;
generating an indication when the third clock signal is aligned with the data signal within a bit margin based on the third phase detection signal; and
adjusting the phase of the fourth clock signal with the second multiplexer based on the indication to adjust the phase of the third clock signal and based on the indication to adjust the phase of the second clock signal.

* * * * *